(12) United States Patent
Barbetta

(10) Patent No.: US 6,762,587 B1
(45) Date of Patent: Jul. 13, 2004

(54) DEVICE AND METHOD FOR MONITORING FUEL CELL PERFORMANCE AND CONTROLLING A FUEL CELL SYSTEM

(75) Inventor: Joseph P. Barbetta, Oradell, NJ (US)

(73) Assignee: Recon Industrial Controls Corp., Englewood, NJ (US)

( * ) Notice: Subject to any disclaimer, the term of this patent is extended or adjusted under 35 U.S.C. 154(b) by 111 days.

(21) Appl. No.: 09/682,508

(22) Filed: Sep. 11, 2001

Related U.S. Application Data

(60) Provisional application No. 60/231,943, filed on Sep. 12, 2000.

(51) Int. Cl.$^7$ ............................................. H01M 10/46
(52) U.S. Cl. ....................................................... 320/116
(58) Field of Search ................................ 320/101, 116, 320/117, 132, 166; 324/433, 434; 429/12, 13

(56) References Cited

U.S. PATENT DOCUMENTS 5,170,124 A * 12/1992 Blair et al.
6,140,820 A * 10/2000 James
6,281,684 B1 * 8/2001 James

* cited by examiner

Primary Examiner—Edward H. Tso
(74) Attorney, Agent, or Firm—Richard A. Joel, Esq.

(57) ABSTRACT

A device and method to measure individual or grouped cell voltages to monitor fuel cell performance for diagnostic or control purposes. More particularly, the present invention involves a device to make attachments to individual cells or groups of cells of a fuel cell stack which measures the voltage or the differences of voltages at a plurality of points of these individual cells or groups of cells, the relationship of these voltages to other fuel cell stack operating parameters, or the fuel cell stack current relationship, transient response, or frequency response of these voltages and uses these measurements to report on the performance of the fuel cell stack, to control fuel cell system parameters based on this performance data, or to isolate individual cells or cell groups. The method further relates to the control of a device to modulate the load current of the fuel cell stack in tandem with the said measurements.

54 Claims, 8 Drawing Sheets

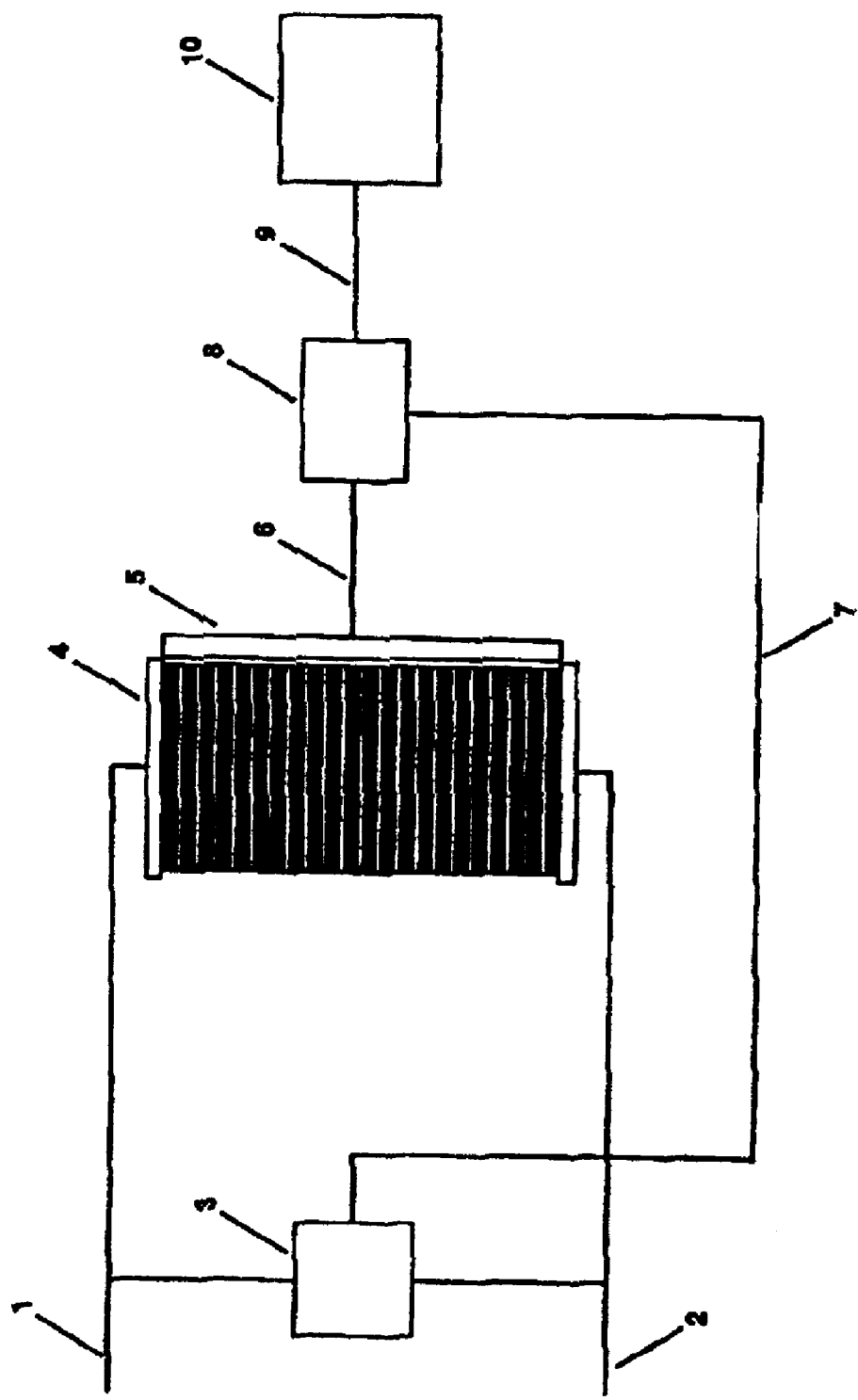

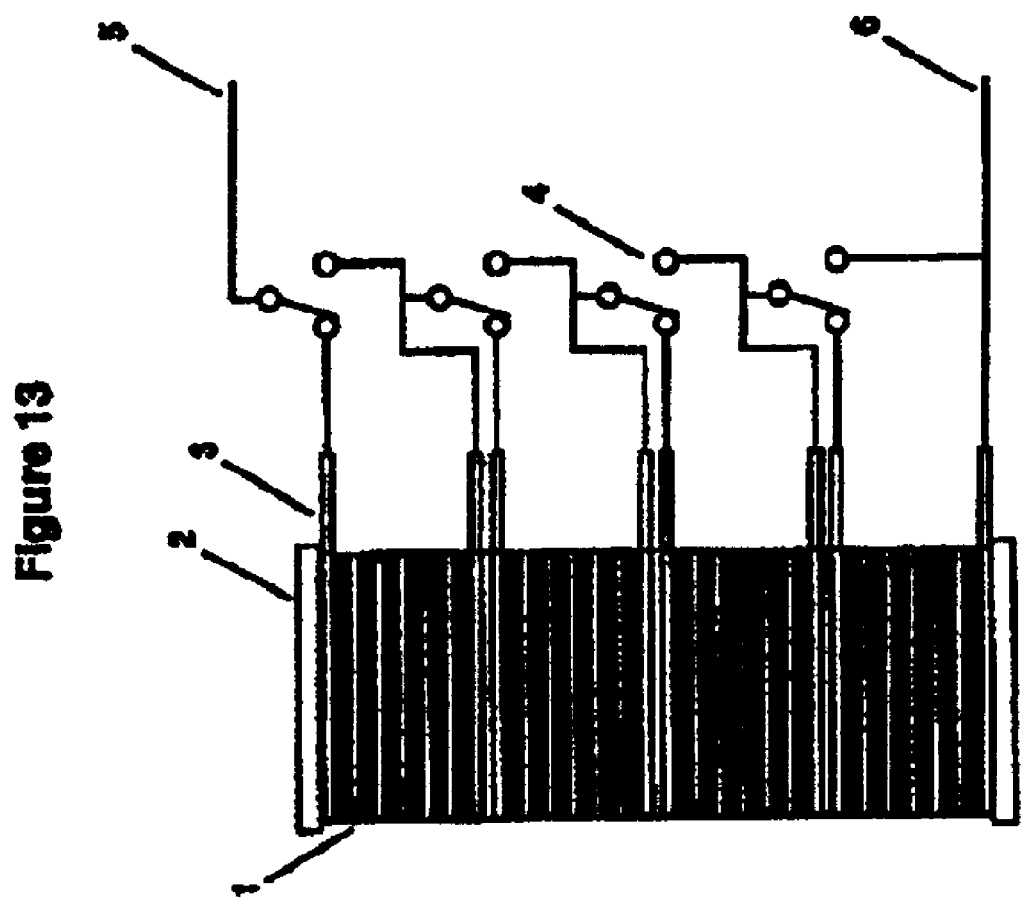

DEVICE AND METHOD FOR MONITORING FUEL CELL PERFORMANCE AND CONTROLLING A FUEL CELL SYSTEM

CROSS REFERENCE TO RELATED APPLICATIONS

This application is based on applicant's provisional application No. 60/231,943 filed on Sep. 12, 2000.

BACKGROUND OF INVENTION

The present invention relates to a device to measure individual or grouped cell voltages to monitor fuel cell performance for diagnostic or control purposes. More particularly, the present invention involves a device to make attachments to individual cells or groups of cells of a fuel cell stack which measures the voltage of these individual cells or groups of cells and uses these measurements, the change in these measurements, or the time response of these measurements to report on the performance of the fuel cell stack and to control fuel cell system parameters or isolate poorly performing cell groups based on this performance data. The present invention also provides a method to measure a plurality of voltages at a plurality of points around the perimeter of cells or cell groups to realize a non-invasion measurement of disproportionate current density distribution across the surface of these cells. The present invention further extends to an associated device in communication with the said measuring device to modulate fuel cell stack current to allow dynamic performance measurements of individual or grouped cells.

Generally speaking a fuel cell is a device that uses an electrochemical process to generate electrical power utilizing the reaction of hydrogen and oxygen. A typical fuel cell is comprised of a multitude of individual fuel cells electrically connected in series to provided a practical voltage output, a voltage equal to the sum of all the individual fuel cells. This arrangement of a multitude of individual cells is referred to as a "fuel cell stack" and each individual cell a "cell." A fuel cell stack typically consists of 10 to 100 cells to realize a total output voltage that is practical for use as an electrical power generation device.

A typical fuel cell system can comprise a fuel cell stack, control or regulating devices for either or both of the reactant fluids (oxygen or air and hydrogen), control or regulating devices for humidification of either or both of the reactant fluids (oxygen or air and hydrogen), control or regulating devices for the cooling fluids (water or air), and a electronic controller to monitor fuel cell stack parameters and adjust control and regulating parameters accordingly.

Since the output voltage of the fuel cell stack equals the sum of all of the individual cells electrically connected in series, the overall performance of the fuel cell stack is an average of the performance of each individual cell. Furthermore, since all these individual cells are electrically connected in series a failure of one individual cell could possibly compromise the performance of the entire fuel cell stack. Therefore to insure the overall performance of the fuel cell stack it is important to monitor the performance of individual cells or groups of cells.

Additionally it is desirable to measure any variation in current density across the plane of cells. A disproportionate current density distribution will manifest itself as differences in cell voltage as measured at different points around the perimeter of a cell. The present invention can allow for voltage measurements to be made at two or more points of the outside perimeter and interpreting these voltage differences and displaying such in a manner to provide an effective determination of a disproportionate current density and hence an operational problem.

It is common for existing control devices to monitor fuel cell stack performance based on the sum of all the cells, but since this voltage is much greater than that of individual cells and the cell voltages have some degree of uncertainty it is impossible to monitor the performance of individual cells and determine performance degradations of individual cells.

It is also desirable for the control system to isolate individual cells or cell groups that are performing poorly and whose performance has not been corrected by control means.

Accordingly, what is needed is a new and useful device and method for measuring individual or grouped cell voltages to monitor fuel cell stack performance for diagnostic or control purposes.

The prior art includes U.S. Pat. No. 6,281,684 to James which is directed to a method and apparatus for measuring cell voltages of a fuel cell stack using different ground references. The apparatus includes scanning units coupled to a fuel cell stack to measure and indicate a voltage of each selected fuel cell in response to a selection signal.

U.S. Pat. No. 6,281,684 to James also discloses a method for measuring cell voltages of a fuel cell stack which similarly includes scanning units coupled to a fuel cell stack.

U.S. Pat. No. 5,170,124 to Blair discloses a method and apparatus for the measurement and comparison of fuel cell performance indicators, such as voltage, in groups of cells connected in series.

The citation of any reference herein should not be construed as an admission that such reference is available as "Prior Art" to the instant application.

SUMMARY OF THE INVENTION

There is provided, in accordance with the present invention, a new, useful, and unobvious device for measuring individual or grouped cell voltages to monitor fuel cell performance for diagnostic or control purposes. Such a device allows performance data to be collected on each individual cell or on groups of cells of the fuel cell stack for stack performance analysis and fuel cell system control.

Broadly, the present invention extends to a device for measuring individual or grouped cell voltages to monitor fuel cell performance for diagnostic or control purposes, wherein the device comprises a contact arrangement which is associated with the fuel cell stack, which makes electrical connections to individual cells of the fuel cell stack and measures the voltages of said individual cells or cell groups. A device of the invention also comprises a monitor and/or controller, which uses these measurements to report on the performance of the fuel cell stack and to control fuel cell system parameters, based on this performance data.

The present invention further extends to an associated device in communication with the said measuring device and in electrical connection with the said fuel cell stack to modulate fuel cell stack current to allow dynamic performance measurements of individual or grouped cells, such as current voltage relationships, voltage transient response, and voltage frequency response.

The present invention further extends to performing said measurements at a multitude of points around the perimeter of individual cells or cell groups. Thus providing a non-invasive method to determine a disproportionate current density distribution across the plane of an individual cell or cell group.

The present invention further extends to associated apparatus in communication with the said measuring device and in electrical connection with individual cells or cell groups in that the said measuring device can instruct said associated apparatus to electrically isolate individual cells or cell groups which could compromise the performance of the entire fuel cell stack.

The present invention finds application in numerous types of fuel cells including, but certainly not limited to PEM (proton exchange membrane), Phosphoric Acid, and Molten Carbonate.

The present invention also finds application in numerous applications of fuel cells including, but certainly not limited to vehicular power, residential cogeneration, power generation, UPS (uninterruptible power supply), backup power, battery replacement, battery charging, and portable power.

These and other objects of the present invention will be better appreciated and understood by those skilled in the art by reference to the following drawings and Detailed Description.

BRIEF DESCRIPTION OF DRAWINGS

FIG. 3 is a block diagram of a monitoring arrangement including a current load according to one embodiment of the invention.

FIG. 13 is a switching apparatus connected to cell groups.

DETAILED DESCRIPTION

Figure 1:
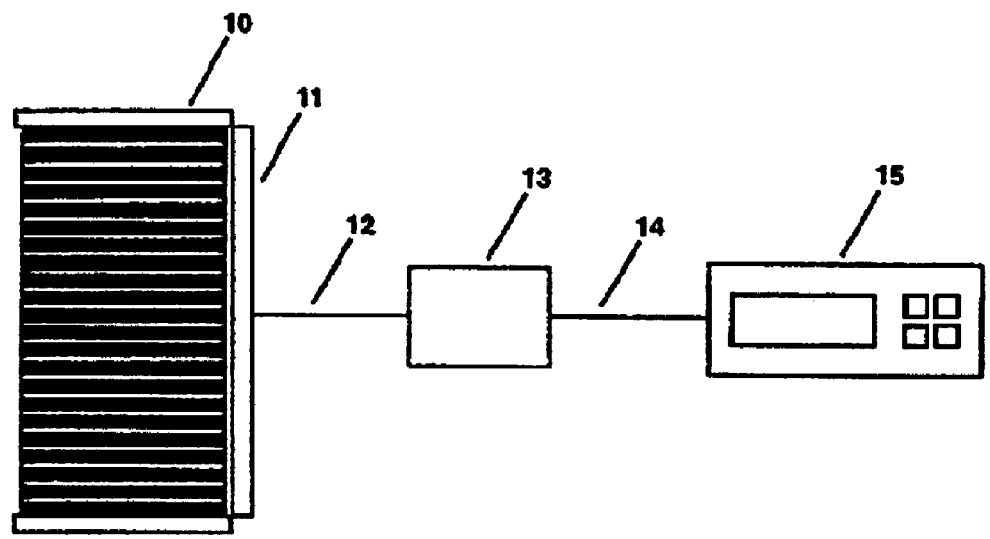
FIG. 1 is a block diagram of a monitoring arrangement according to the present invention.

The present invention involves a device to measure individual or grouped cell voltages to monitor fuel cell performance for diagnostic or control purposes. More particularly, the present invention involves a device to make attachments to individual cells or groups of cells of a fuel cell stack which measures the voltage of these individual cells or groups of cells and uses these measurements to report on the performance of the fuel cell stack and to control fuel cell system parameters based on this performance data. Consequently, an apparatus of the invention is new, useful and unobvious in light of heretofore known devices. Many other variations and modifications of a device of the invention will apparent to those skilled in the art without departing from the spirit and scope of the invention. The above-described embodiments are therefore, included to be merely exemplary, and all such variations and modifications are intended to be included within the scope of the invention as defined in the appended Claims.

As explained above, FIG. 1 is a block diagram of a monitoring arrangement according to the present invention. The monitoring arrangement shown in FIG. 1 includes a fuel cell stack (10), a cell contact assembly (11), a multiple conductor electrical signal path (12) from the cell contact assembly to a meter (13), an electrical signal path (14) from the meter to a monitor (15).

Referring again to FIG. 1, contact assembly (11) is associated with fuel cell stack (10). In a device of the present invention, contact assembly (11) associated with fuel cell stack (10) can be embedded in fuel cell stack (10), or mounted on fuel cell stack (10). Contact assembly (11) makes electrical connections with conductive areas of cells of fuel cell stack (10). Numerous mounting and positioning methods have applications in a device of the present invention. Particular examples of such methods include, but certainly are not limited to printed circuit boards, and machined bracket assemblies.

Still referring to FIG. 1, contact assembly (11) is connected to meter (13) by means of a multiple conductor signal path (12) with at least one electrical path per cell or cell group. Numerous examples of such multiple conductor signal paths include, but certainly are not limited to ribbon cable, individual wires, and flexible circuit boards.

Meter (13) measures voltages of individual cells or cell groups and communicates said voltage measurements or performance data via electrical signal path (14) to monitor (15). Monitor (15) provides a display method to provide a user with performance data of fuel cell stack (10). Numerous examples of such display methods include, but certainly are not limited to LED (light emitting diode) displays, LCD (liquid crystal displays), and VFD (vacuum fluorescent displays).

Figure 2:
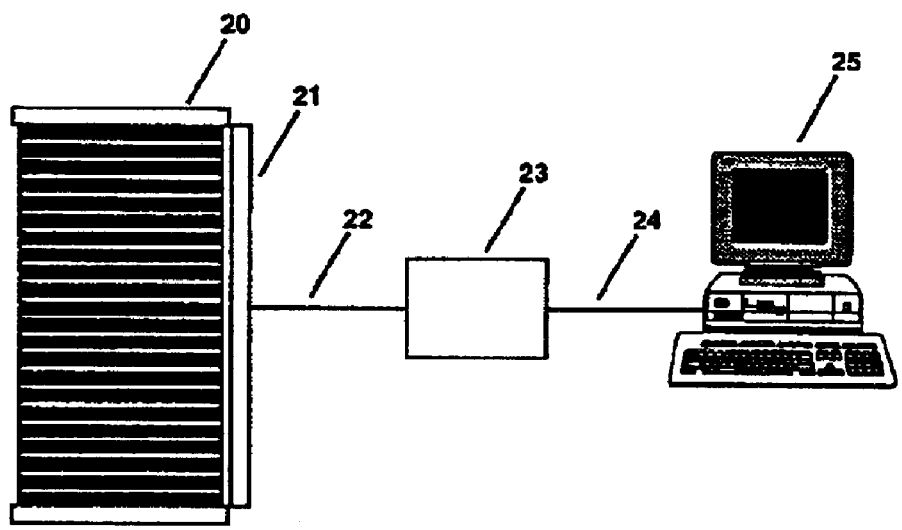
FIG. 2 is a block diagram of a monitoring arrangement including a personal computer as a monitor.

As an alternate monitoring arrangement, FIG. 2 is a block diagram of a monitoring arrangement according to the present invention that includes a personal computer (25) used as a monitor. The monitoring arrangement shown in FIG. 1 includes a fuel cell stack (20), a cell contact assembly (21), a multiple conductor electrical signal path (22) from the cell contact assembly to a meter (23), an electrical signal path (24) from the meter to a personal computer (25).

Referring again to FIG. 2, contact assembly (21) is associated with fuel cell stack (20). In a device of the present invention, contact assembly (21) associated with fuel cell stack (20) can be embedded in fuel cell stack (20), or mounted on fuel cell stack (20). Contact assembly (21) makes electrical connections with conductive areas of cells of fuel cell stack (20). Numerous mounting and positioning methods have applications in a device of the present invention. Particular examples of such methods include, but certainly are not limited to printed circuit boards, and machined bracket assemblies.

Still referring to FIG. 2, contact assembly (21) is connected to meter (23) by means of a multiple conductor signal path (22) with at least one electrical path per cell or cell group. Numerous examples of such multiple conductor signal paths include, but certainly are not limited to ribbon cable, individual wires, and flexible circuit boards.

Meter (23) measures voltages of individual cells or cell groups and communicates said voltage measurements or performance data via electrical signal path (24) to personal computer (25). Personal computer (25) provides a display method to provide a user with performance data of fuel cell stack (20). Numerous examples of such display methods include, but certainly are not limited to desktop computers, laptop computers, notebook computers, and PDA (personal digital assistant) devices. Software run on the personal computer (25) provides a presentation of the performance of individual cells, cell groups, or the entire fuel cell stack (20). The software run on the personal computer is developed using routine programming techniques readily available to one of ordinary skill in the art.

As explained above, FIG. 3 is a block diagram of a monitoring arrangement according to the present invention further extended to include a current load (3). The monitoring arrangement shown in FIG. 3 includes a fuel cell stack (4), a current load (3) connected between current paths (1,2), a current load signal path (7), a cell contact assembly (5), a multiple conductor electrical signal path (6) from the cell contact assembly to a meter (8), an electrical signal path (9) from the meter to a monitor (10).

Referring again to FIG. 3, current load (3) is instructed by meter (8) to modulate current of fuel cell stack (4) through current paths (1,2). Numerous examples of such a current load include, but certainly are not limited to one or more bipolar transistors, IGBT's (insulated gate bipolar transistor), MOSFET's (metal oxide silicon field effect transistor), solid state relays, electronic loads, galvanostats, potentiostats, amplifiers, and mechanical relays.

Still referring to FIG. 3, voltage change, transient or frequency response of individual cells or cell groups of fuel cell stack (4) are measured by meter (8) through multiple conductor signal path (6) and contact assembly (5). Voltage change, transient or frequency response measured by meter (8) or performance data calculated is communicated through electrical signal path (9) to monitor (10).

Figure 4:
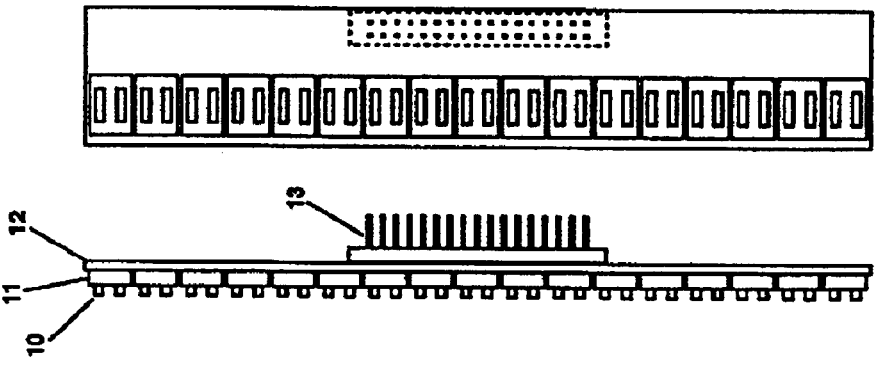
FIG. 4 includes side and top views of a spring contact cell contact arrangement.

FIG. 4 shows one embodiment of a contact module. Flexible electrically conductive contacts (10) of electrical connectors (11) make electrical contact with conductive exposed area of fuel cells. Electrical connectors (11) are supported by and properly spaced on a printed circuit board (12) which makes electrically conductive signal paths to cable connector (13).

Figure 5:
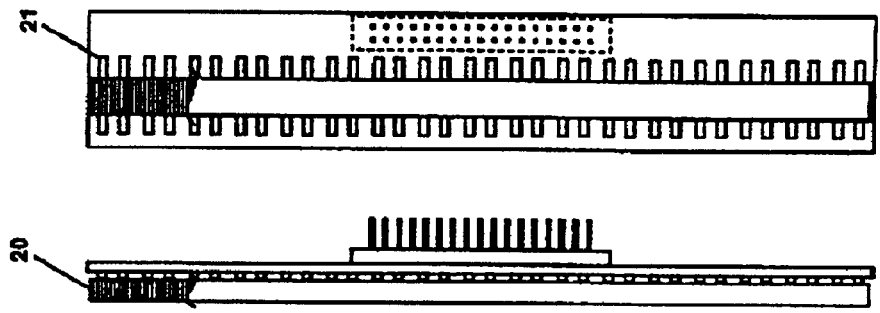
FIG. 5 includes side and top views of an elastomer contact cell contact arrangement.

FIG. 5 shows another embodiment of a contact module. A flexible and compressible elastomeric strip (20) provides an electrically conductive signal path between the conductive exposed area of fuel cells and conductive traces (21).

Figure 6:
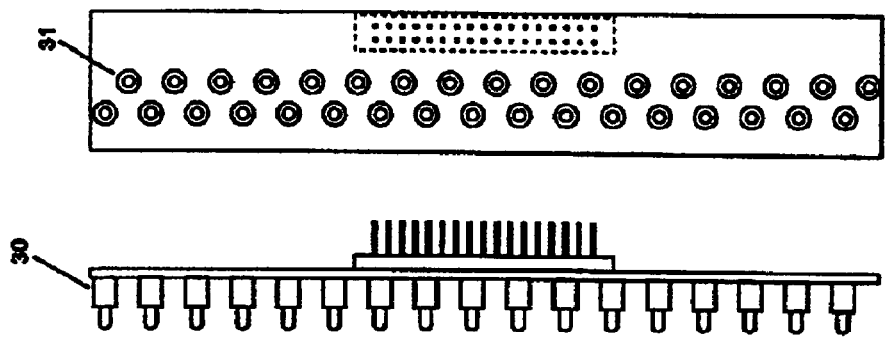
FIG. 6 includes side and top views of a cylindrical spring contact cell contact arrangement.

FIG. 6 shows another embodiment of a contact module. Movable electrically conductive contact pins (31) supported by spring loaded bodies (30) make electrical contact with conductive exposed area of fuel cells.

Figure 7:
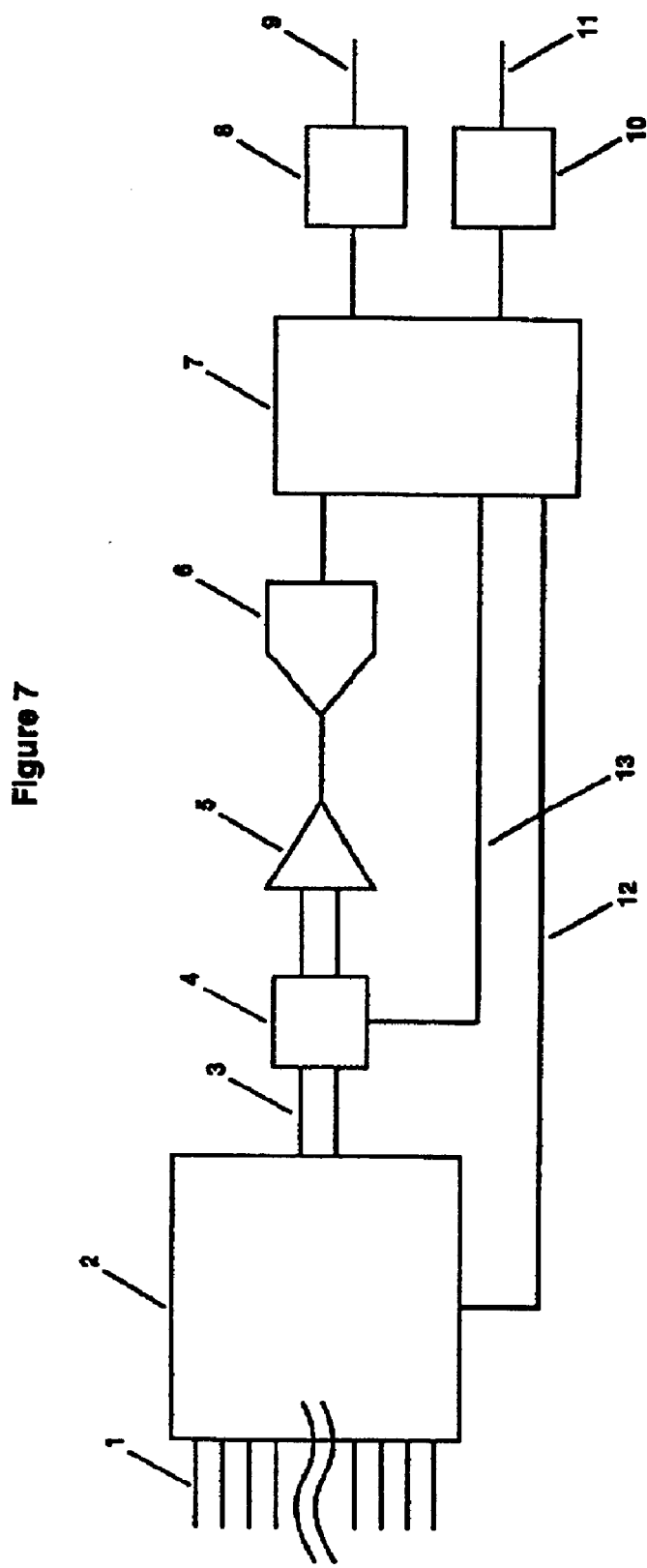
FIG. 7 is a block diagram of a meter according to the present invention.

As explained above, FIG. 7 is a block diagram of a meter according to the present invention. Electrical signals of the individual or grouped cells (1) are input to multiplexor (2). Microprocessor (7) instructs multiplexor (2) via multiplexor control signal (12) to select one of electrical signals of the individual or grouped cells which appears as multiplexor output signal (3). Microprocessor instructs attenuator (4) via attenuator control signal to attenuate or lessen multiplexor output signal (3) to provide amplifier (5) with proper signal voltage range. Converter (6) converts analog voltage signal from amplifier (5) to a digital voltage signal read by microprocessor (7). Microprocessor analyzes and interprets digital voltage signal to determine performance data and instructs communication interface (8) to communicate said performance data to monitor via monitor communication port (9). Microprocessor determines if said performance meets alarm criteria and if alarm criteria is met activates alarm output (10) to communicate alarm status to an external device via alarm communication port (11).

Numerous examples of microprocessors include, but certainly are not limited to 8 bit microcontrollers, 16 bit microcontrollers, 8 bit microprocessors, 16 bit microprocessors, DSP's (digital signal processor), ASIC's (application specific Integrated circuit), FPGA's (field programmable gate array). Moreover, a microprocessor can be readily programmed to read digital data from converter (6) and analyze and interpret said data to determine performance data using routine programming procedures known to the skilled artisan.

An example of an attenuator would include a voltage divider comprised of two resistors in which the amount of attenuation is controlled by the ratio of values of said two resistors.

Numerous examples of amplifiers include, but certainly are not limited to operational amplifiers, instrumentation amplifiers, and voltage buffers.

Numerous examples of converters include, but certainly are not limited to 8 bit A/D's (analog/digital), 12 bit A/D's, 16 bit A/D's, 24 bit A/D's, delta-sigma converters, dual slope converters, integrating converters, VCO's (voltage controlled oscillator), VFC's (voltage to frequency converter), modulators, sampling converters, flash converters, and successive approximation converters.

Numerous examples of communication interfaces include, but certainly are not limited to RS-485, RS-422, RS-232, USB (universal serial bus), CAN (control area network), PWM (pulse width modulation), and PFM (pulse frequency modulation).

Numerous examples of alarm outputs include, but certainly are not limited to mechanical relays, solid state relays, transistors, and optoisolators.

Figure 8:
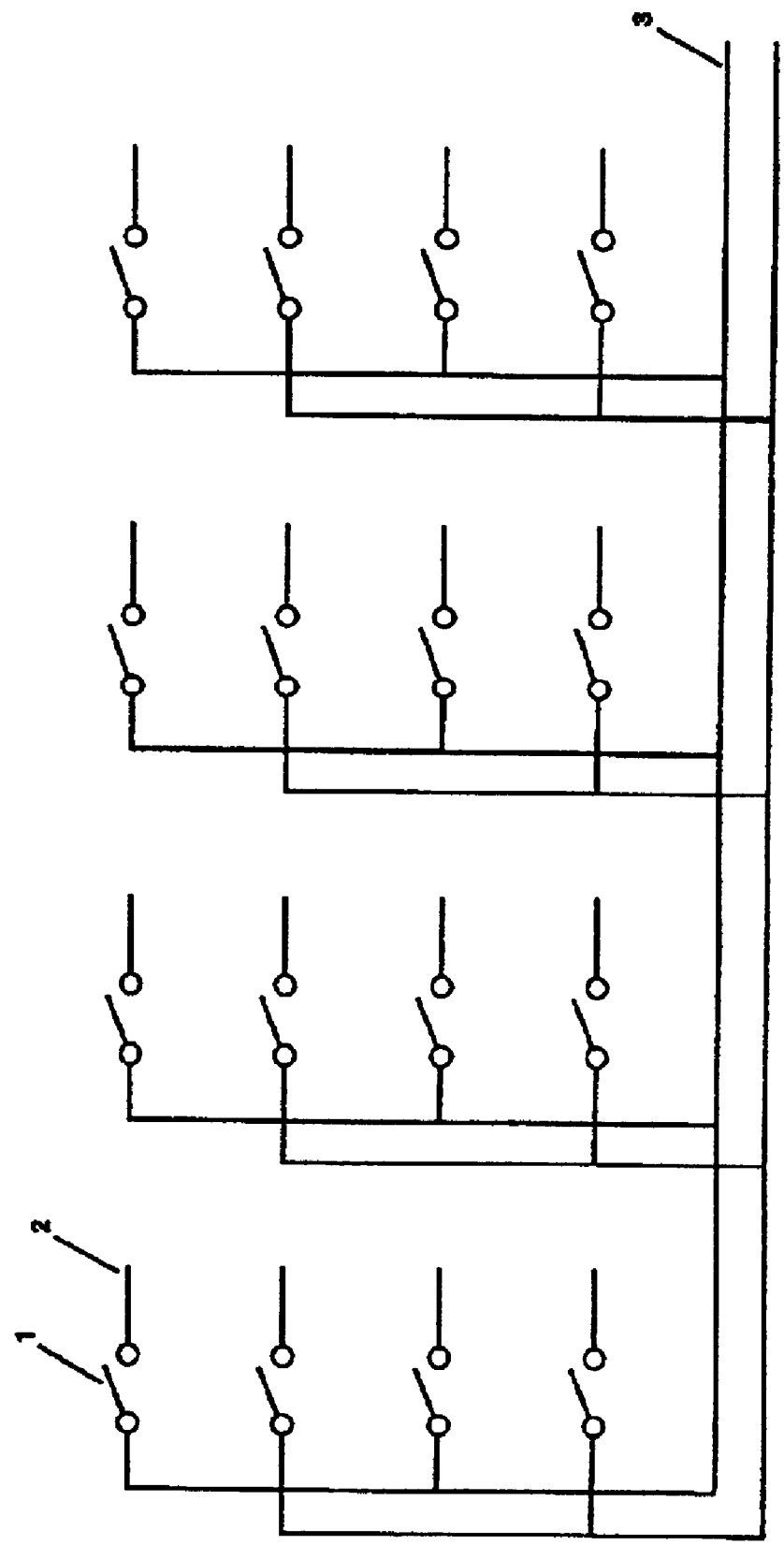
FIG. 8 is a schematic view of a multiplexor.

FIG. 8 shows one embodiment of a multiplexor. Two switches (1) in association with and electrical connection to individual cell or grouped cell voltage signals (2) provide an electrical signal path to multiplexor output (3). Numerous examples of switches include, but certainly are not limited to mechanical relay contacts, solid state relay contacts, MOSFET's (metal oxide silicon field effect transistor), bipolar transistors, optoisolators, optocouplers, reed switches, and rotary mechanical contactors.

Figure 9:
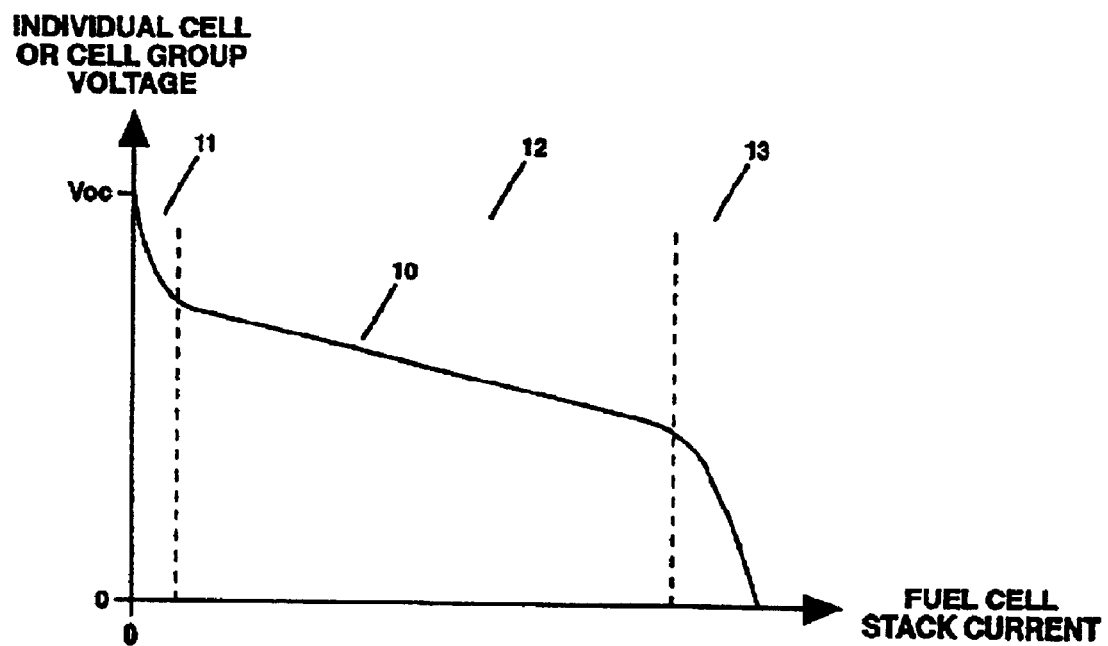
FIG. 9 is an IV curve of the voltage to current relationship of an individual cell or cell group.

FIG. 9 shows one embodiment of an IV curve. A curve (10) represents the relationship of voltage of a individual cell or cell group to fuel cell stack current. Nonlinearities of this curve (10) are due to the combination of electrical characteristics, electrochemical processes, and physical processes. In a low current region (11) an electrochemical process is the majority contributor to curve (10). In a mid current region (12) an electrical characteristic is the majority contributor to curve (10). In a high current region (13) a physical process is the majority contributor to curve (10).

Figure 10:
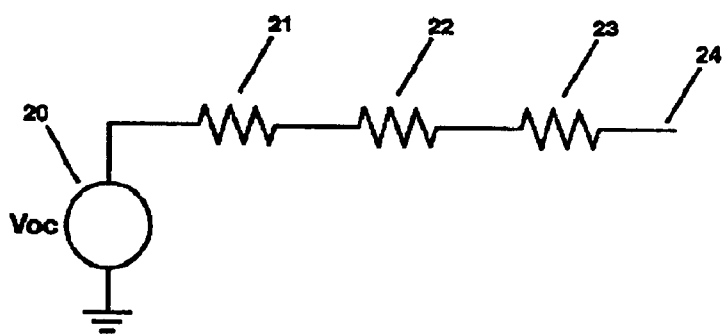
FIG. 10 is a Thevenin equivalency model of an individual cell or cell group.

FIG. 10 shows one embodiment of a Thevenin equivalency model of an individual cell or cell group. A voltage source (20) represents the open circuit voltage present at output terminal (24) when the fuel cell stack current is equal to zero. Ohmic resistance (21) represents the resistance due to electrical characteristics. Electrochemical process resistance (22) represents the resistance due to electrochemical processes. Physical process resistance (23) represents the resistance due to physical processes.

Figure 11:
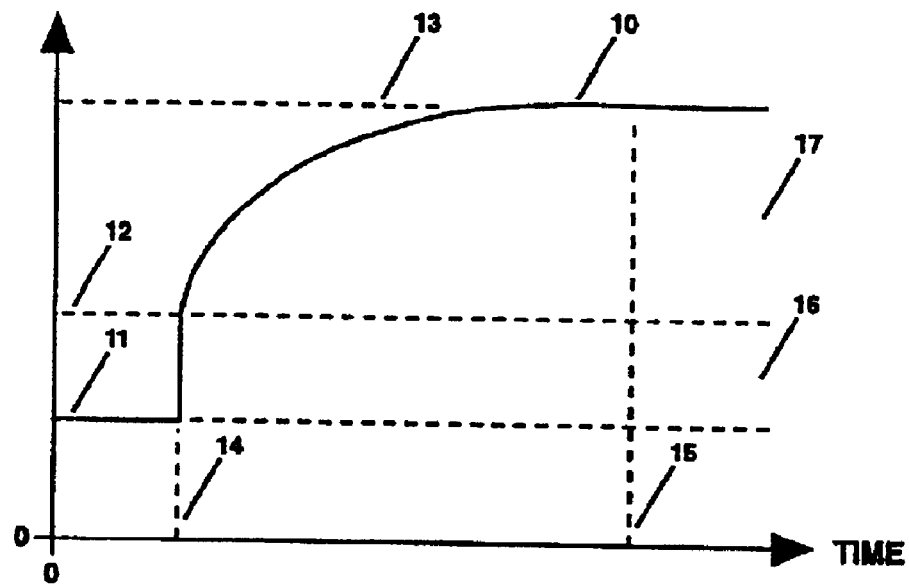
FIG. 11 is voltage transient response curve of an individual cell or cell group.

FIG. 11 shows one embodiment of a voltage transient response curve of an individual cell or cell group. A curve

(10) represents the voltage of individual cells or cell groups as a function of time. Curve (10) starts at a steady voltage, t<0, (11) before fuel cell stack current change time (14). At fuel cell stack current change time (14) curve (10) immediately approaches voltage, t=0, (12). This voltage change in fast voltage change region (16) is due to electrical characteristics. In the slow voltage change region (17) curve (10) eventually approaches a low or zero current voltage (13) at time (15). The voltage change in slow voltage change region (17) is due to electrochemical and physical processes.

Figure 12:
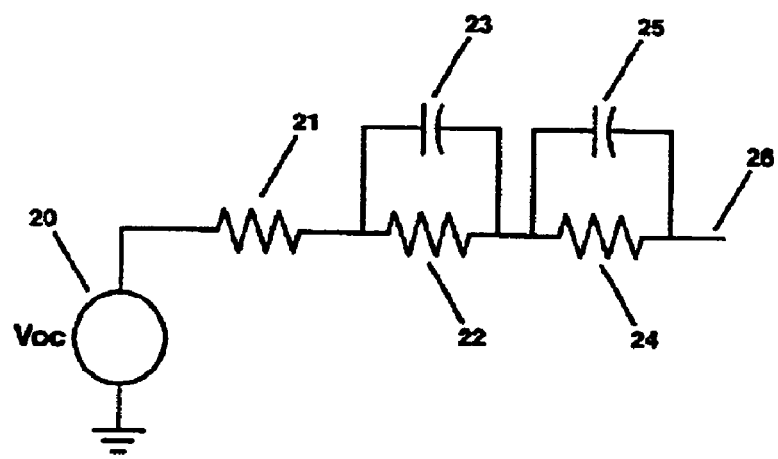
FIG. 12 is a Thevenin equivalency model of an individual cell or cell group.

FIG. 12 shows one embodiment of a Thevenin equivalency model of an individual cell or cell group. A voltage source (20) represents the open circuit voltage present at output terminal (26) when the fuel cell stack current is equal to zero. Ohmic resistance (21) represents the resistance due to electrical characteristics. Electrochemical process resistance (22) represents the resistance due to electrochemical processes. Electrochemical process capacitance (23) represents the time constant due to the electrochemical process. Physical process resistance (24) represents the resistance due to physical processes. Physical process capacitance (25) represents the time constant due to physical processes.

FIG. 13 shows one embodiment of a switching apparatus connected to cell groups. A plurality of individual cells (1) of fuel cell stack (2) are in electrical connection with current plates (3) connected to electrical switches (4) so that one or more cell groups can be removed and isolated from the remaining fuel cell groups of the fuel cell stack (2) whose current passes through connections (5,6). One or more switches under instruction of said measuring device can switch to isolate said individual cells or cell groups to isolate cell group and provide bypass current path. If said measuring device determines that an individual cells or cell groups are performing poorly or have been permanently damaged it can instruct said switching apparatus to isolate said individual cells or cell groups so as to not adversely affect entire fuel cell stack performance.

Numerous examples of such switches include, but certainly are not limited to bipolar transistors, IGBT's (insulated gate bipolar transistor), MOSFET's (metal oxide silicon field effect transistor), solid state relays, and mechanical relays.

Many other variations and modifications of a device of the invention will apparent to those skilled in the art without departing from the spirit and scope of the invention. The above-described embodiments are therefore, included to be merely exemplary, and all such variations and modifications are intended to be included within the scope of the invention as defined in the appended Claims.

What is claimed is:

1. A device to measure individual or grouped cell voltages of a fuel cell stack having conductive areas to monitor fuel cell stack performance to provide diagnostic data, said device comprising:
   a meter connected to individual or grouped cell conductive areas to measure the voltage and impedance of said individual or grouped cells changes in the measurement or the time response of the measurements; and
   a monitor coupled to said meter to report on the performance of the fuel cell stack, such that the measurements of said individual or grouped cells are used to report on the performance of said fuel cell stack and further including a matrix array of opto isolators wherein no common ground is employed by the meter.

2. The device of claim 1, wherein said meter instructs said monitor to report on individual cells, grouped cells, or entire fuel cell stack performance.

3. The device of claim 1, wherein said meter provides electrical isolation between individual cells or group cells connected to and external electrical connections of said meter.

4. The device of claim 1, wherein said meter includes:
   an alarm or an electrical connection for an external alarm device.

5. The device of claim 1, wherein said monitor includes:
   a personal computer running interface and monitoring software.

6. The device of claim 1, wherein said monitor:
   displays present, minimum, maximum, and average voltages or impedance of individual cells or grouped cells or of performance parameters based on these voltages.

7. The device of claim 1, wherein said monitor:
   provides a strip chart or graphical trend of voltages of individual cells or grouped cells or of performance parameters based on these voltages.

8. The device of claim 1, wherein said monitor:
   logs or stores a history of voltages of individual cells or grouped cells or of performance parameters based on these voltages.

9. The device of claim 1, wherein said monitor:
   displays impedance models based on voltages of individual cells or grouped.

10. The device of claim 1, wherein said monitor:
    provides automated sequencing and data collection of performance tests.

11. The device of claim 1, further includes batteries or supercapacitors coupled to said cells.

12. The device of claim 1 further including:
    one or more additional meters connected to said meter to allow the measurement of voltages of additional individual cells or grouped cells further including
    a meter connected to individual or grouped cell conductive areas to measure the voltage of said individual or grouped cells; and
    a monitor coupled to said meter to report on the performance of the fuel cell stack such that the measurements of said individual or grouped cells are used to report on the performance of said fuel cell stack.

13. The device of claim 12, wherein said microprocessor determines the performance of individual cells or cell groups based on the present operating current of the fuel cell stack.

14. The device of claim 12, wherein said microprocessor determines the performance of individual cells or cell groups based on voltage measurements of said individual cells or cell groups in addition to at least one other fuel cell system parameter.

15. A device to measure individual or grouped cell voltages of a fuel cell stack having conductive areas to monitor fuel cell stack performance to provide diagnostic data wherein said meter further includes:
    a voltage or current excitation source in electrical connection with said multiplexer and temperature sensing devices to provide for a method to allow compatibility with temperature sensing devices to allow multiple point temperature measurements
    wherein said meter is connected to individual or grouped cell conductive areas to measure the voltage of said individual or grouped cells; and
    a monitor coupled to said meter to report on the performance of the fuel cell stack such that the measurements of said individual or grouped cells are used to report on the performance of said fuel cell stack.

16. A device to measure individual or grouped cell voltages of a fuel cell stack having conductive areas to monitor fuel cell stack performance to adjust fuel cell system operating parameters to optimize fuel cell stack performance and to maintain safe operating conditions:
- a meter connected to individual or grouped cell conductive areas to measure the voltage or impedance of said individual or grouped cells and further including a matrix array of opto isolators to eliminate the need for a common ground; and
- a controller coupled to with or comprised in part of said meter to adjust fuel cell system operating parameters,
- such that the measurements of said individual or grouped cells are used to adjust fuel cell system operating parameters to optimize fuel cell stack performance and to maintain safe operating conditions.

17. The device of claim 16, wherein said meter instructs said controller to adjust fuel cell system operating parameters to optimize fuel cell stack performance and to maintain safe operating conditions.

18. The device of claim 16, wherein said meter instructs said controller to perform a fuel cell system shutdown procedure to avoid unsafe operating conditions or fuel cell stack damage.

19. The device of claim 16, wherein said meter provides electrical isolation including opto isolators between individual cells or grouped cells connected thereto and external electrical connections of said meter.

20. The device of claim 16, wherein said meter further includes a voltage or current excitation source in electrical connection with said multiplexor to provide for a method to allow compatibility with temperature sensing devices to allow multiple point temperature measurements.

21. The device of claim 16, wherein said meter further includes an alarm or an electrical connection for an external alarm device.

22. The device of claim 16, further including switches wherein said controller instructs switches electrically connected to individual cells or cell groups to isolate said individual cells or cell groups and provide a current bypass.

23. The device of claim 16, wherein said controller controls at least one control parameter of the fuel cell system.

24. The device of claim 23, wherein said controller modulates the temperature of the fuel cell stack.

25. The device of claim 23, wherein said controller modulates the temperature of at least one of the reactant gases entering the fuel cell stack.

26. The device of claim 23, wherein said controller modulates the humidification of at least one of the reactant gases entering the fuel cell stack.

27. The device of claim 23, wherein said controller modulates the flow of at least one of the reactant gases entering the fuel cell stack.

28. The device of claim 23, further including reactant gases and wherein said controller modulates or limits the output load current of the fuel cell stack.

29. The device of claim 23, wherein said controller modulates control parameters according to individual or grouped cell performance parameters.

30. A device to measure individual or grouped cell voltages of a fuel cell stack having conductive areas to monitor fuel cell stack performance to provide diagnostic data, said add device comprising:
- a meter connected to individual or grouped cell conductive areas to measure the voltage of said individual or grouped cells; and
- a monitor coupled to said meter to report on the performance of the fuel cell stack such that the measurements of said individual or grouped cells are used to report on the performance of said fuel cell stack wherein said meter further includes
  - a contact assembly associated with said individual or grouped cell conductive areas, wherein said contact assembly is electrically connected to said individual or grouped cell conductive areas; and
  - a multiplexer to switch between electrical connections of individual or grouped cells establishing an electrical signal path from an individual cell or group of cells; and,
  - an attenuator/amplifier to attenuate or amplify said electrical signal from said multiplexer; and,
  - a converter to convert the electrical signal from said attenuator/amplifier from an analog signal to a digital signal; and,
  - a microprocessor to read and interpret said digital signal, and
  - wherein said microprocessor communicates the measurement value or any diagnostic data based on said measurement to said monitor.

31. The device of claim 30 wherein said microprocessor determines the performance of individual cells or cell groups based on the present operating current of the fuel cell stack.

32. The device of claim 30 wherein said microprocessor determines the performance of individual cells or cell groups based on voltage measurements of said individual cells or cell groups in addition to at least one other fuel cell system parameter.

33. The device of claim 30 wherein said microprocessor determines the performance of individual cells or cell groups based on a logged history of voltage measurements of said individual cells or cell groups and other fuel cell system parameters.

34. The device of claim 30 wherein said microprocessor measures the contact resistance between electrical contacts of said contact assembly and said conductive areas of said individual cells or cell groups, to determine the condition of an poor electrical connection and potential false voltage reading.

35. The device of claim 30 wherein said meter further includes:
- an electrical connection from said multiplexor output to allow connection of the multiplexor output signal to external measurement devices.

36. The device of claim 30 wherein said contact assembly a plurality of electrical connections positioned at a plurality of points around the perimeter of said individual or grouped cells.

37. The device or claim 36, wherein said meter interprets differences in voltages, measured at a plurality of points around the perimeter of said individual or grouped cells, to provide a determination of a disproportionate current density distribution across the plane of individual cells.

38. The device of claim 30 wherein said microprocessor instructs a current load in communication with said microprocessor, electrically connected to said fuel cell stack, to provide a current load to the fuel cell stack in order to measure the voltage of individual cells or cell groups at various fuel cell stack-operating currents.

39. The device of claim 38, wherein said current load is a battery charger coupled to said microprocessor.

40. The device of claim 30 wherein said microprocessor determines the performance of individual cells or cell groups based on measurements of the time response of the voltage of said individual cells or cell groups during a transient response caused by a high rate of change of fuel cell stack current.

41. The device of claim 40, wherein said microprocessor instructs a current load, electrically connected to said fuel cell stack, to modulate the current of the fuel cell stack in order to measure the transient response of the voltage of individual cells or cell groups.

42. The device of claim 30 wherein said microprocessor determines the performance of individual cells or cell groups based on measurements of the frequency response of the voltage of said individual cells or cell groups during a response caused by a periodic change of fuel cell stack current.

43. The device of claim 42, wherein said microprocessor instructs a current load electrically connected to said fuel cell stack, to modulate the current of the fuel cell stack in order to measure the frequency response of the voltage of individual calls or cell groups.

44. A device to measure individual or grouped cell voltages of a fuel cell stack having conductive areas to monitor fuel cell stack performance to adjust fuel cell system operating parameters to optimize fuel cell stack performance and to maintain safe operating conditions:
   a meter connected to individual or grouped cell conductive a to measure the voltage of said individual or grouped cells; and
   a controller coupled to with or comprised in part of said meter to adjust fuel cell system operating parameters, such that the measurements of said individual or grouped cells are used to adjust fuel cell system operating parameters to optimize fuel call stack performance and to maintain safe operating conditions;
   a contact assembly associated with said individual or grouped cell conductive areas, wherein said contact assembly is electrically connected to said individual or grouped cell conductive areas; and,
   a multiplexer to switch between electrical connections of individual or grouped cells establishing an electrical signal path from an individual cell or group of cells; and,
   an attenuator/amplifier to attenuate or amplify said electrical signal from said multiplexer; and,
   a converter to convert the electrical signal from said attenuator/amplifier from an analog signal to a digital signal; and,
   a microprocessor to read and interpret said digital signal, wherein said microprocessor communicates the measurement value or any evaluations based on said measurement to said controller.

45. The device of claim 44 wherein said meter further includes an electrical connection from said multiplexor output to allow connection of the multiplexor output signal to external measurement devices.

46. The device of claim 44 further including:
   one or more additional meters to allow the measurement of voltages of additional individual cells or grouped cells connected to said meter.

47. The device of claim 44 wherein said microprocessor measures the contact resistance between electrical contacts, of said contact assembly and said conductive areas of said individual cells or cell groups, to determine the condition of an poor electrical connection and potential false voltage reading.

48. The device of claim 44 wherein said microprocessor determines:
   the performance of individual cells or cell groups based on voltage measurements of said individual cells or cell groups in addition to at least one other fuel cell system parameter, and,
   the performance of individual cells or cell groups based on a logged history of voltage measurements of said individual cells or cell groups and other fuel cell system parameters.

49. The device of claim 44 wherein said microprocessor instructs a current load in communication with said microprocessor, electrically connected to said fuel cell stack, to provide a current load to the fuel cell stack in order to measure the voltage of individual cells or cell groups at various fuel cell stack-operating currents.

50. The device of claim 49, wherein said current load is a battery charger in communication with said microprocessor.

51. The device of claim 44 wherein said microprocessor determines the performance of individual cells or cell groups based on measurements of the time response of the voltage of said individual cells or cell groups during a transient response caused by a high rate of change of fuel cell stack current.

52. The device of claim 51, wherein said microprocessor instructs a current load, electrically connected to said fuel cell stack, to modulate the current of the fuel cell stack in order to measure the transient response of the voltage of individual cells or cell groups.

53. The device of claim 44 wherein said microprocessor determines the performance of individual cells or cell groups based on measurements of the frequency response of the voltage of said individual cells or cell groups during a response caused by a periodic change of fuel cell stack current.

54. The device of claim 53, wherein said microprocessor instructs a current load, electrically connected to said fuel cell stack, to modulate the current of the fuel cell stack in order to measure the frequency response of the voltage of individual cells or cell groups.

* * * * *